United States Patent
Kluger et al.

(10) Patent No.: US 9,382,960 B2
(45) Date of Patent: Jul. 5, 2016

(54) BEAM-BASED NONLINEAR SPRING

(71) Applicant: Massachusetts Institute of Technology, Cambridge, MA (US)

(72) Inventors: Jocelyn Maxine Kluger, South Glastonbury, CT (US); Alexander Henry Slocum, Bow, NH (US); Themistoklis Panagiotis Sapsis, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/603,492

(22) Filed: Jan. 23, 2015

(65) Prior Publication Data

US 2015/0233440 A1    Aug. 20, 2015

Related U.S. Application Data

(60) Provisional application No. 61/941,593, filed on Feb. 19, 2014.

(51) Int. Cl.

| | |
|---|---|
| *F16F 1/22* | (2006.01) |
| *H02K 7/18* | (2006.01) |
| *G01L 1/00* | (2006.01) |
| *F03G 1/00* | (2006.01) |
| *F03G 1/02* | (2006.01) |
| *F03G 1/10* | (2006.01) |
| *F03G 7/08* | (2006.01) |

(Continued)

(52) U.S. Cl.
CPC ... *F16F 1/22* (2013.01); *F03G 1/00* (2013.01); *F03G 1/02* (2013.01); *F03G 1/10* (2013.01); *F03G 7/08* (2013.01); *G01L 1/00* (2013.01); *G01L 1/044* (2013.01); *H02K 7/1876* (2013.01); *H02K 35/02* (2013.01)

(58) Field of Classification Search
CPC .............. F03G 1/00; F03G 1/02; F16F 1/18; F16F 1/22; G01L 1/00; G01L 1/04; G01L 1/044; H02K 7/1853
See application file for complete search history.

(56) References Cited

U.S. PATENT DOCUMENTS

| | | | |
|---|---|---|---|
| 3,727,900 A | 4/1973 | Casey | |
| 4,037,675 A | 7/1977 | Storace et al. | |
| 4,338,825 A * | 7/1982 | Amlani | G01G 3/1412 177/156 |

(Continued)

FOREIGN PATENT DOCUMENTS

| | | |
|---|---|---|
| CN | 203376037 | 1/2014 |
| EP | 0343774 A3 | 11/1990 |
| GB | 1330718 | 9/1971 |

OTHER PUBLICATIONS

Load cell Applications, Futek Advanced Sensor Technology, Inc. http://www.futek.com/application/load-cell.

(Continued)

*Primary Examiner* — Daniel S Larkin
(74) *Attorney, Agent, or Firm* — Sam Pasternack; MIT Technology Licensing Office

(57) ABSTRACT

Nonlinear spring. In one embodiment, the spring includes two opposed curved surfaces curving away from one another. A flexible cantilever member is disposed between the two opposed curved surfaces and a mass is attached to a free end of the cantilever member wherein the flexible cantilever member wraps around one of the curved surfaces as the cantilever member deflects to form a nonlinear spring. Energy harvesting devices and a load cell are also disclosed.

4 Claims, 13 Drawing Sheets

(51) Int. Cl.
   G01L 1/04    (2006.01)
   H02K 35/02    (2006.01)

(56) References Cited

U.S. PATENT DOCUMENTS

| | | | |
|---|---|---|---|
| 4,711,314 | A | 12/1987 | Suzuki et al. |
| 5,641,912 | A * | 6/1997 | Manahan, Sr. ............ G01N 3/18 374/50 |
| 6,193,225 | B1 | 2/2001 | Watanabe |
| 7,005,778 | B2 | 2/2006 | Pistor |
| 7,061,262 | B2 | 6/2006 | Mai |
| 7,521,841 | B2 | 4/2009 | Clingman et al. |
| 7,631,554 | B2 | 12/2009 | Behrends et al. |
| 7,710,227 | B2 | 5/2010 | Schmidt |
| 8,040,023 | B2 | 10/2011 | Laermer et al. |
| 8,222,754 | B1 | 7/2012 | Soliman et al. |
| 8,777,195 | B2 | 7/2014 | Carvey et al. |

OTHER PUBLICATIONS

Gasmi et al., Closed-form solution of a shear deformable, extensional ring in contact between two rigid surfaces, International Journal of Solids and Structures, Mar. 1, 2011, pp. 843-853, vol. 48(5), Elsevier.

Calio et al., Piezoelectric Energy Harvesting Solutions. Sensors: Modeling, Testing and Reliability Issues in MEMS Engineering, Mar. 10, 2014, pp. 4755-4790, vol. 14(3), MDPI AG, Basel, Switzerland.

Mitcheson et al., Architectures for Vibration-Driven Micropower Generators. J. Microelectromechanical Systems, Jun. 2004, pp. 429-440, 13-3, IEEE.

Hajati et al., Design and Fabrication of a Nonlinear Resonator for Ultra Wide-Bandwith Energy Harvesting Applications. In: Proceedings of the IEEE International Conference on Micro Electro Mechanical Systems, 2011, pp. 1301-1304, IEEE, Cancun, Mexico.

Yaglioglu, Modeling and design considerations for a micro-hydraulic piezoelectric power generator, 2002, Massachusetts Institute of Technology, Cambridge, MA.

Gendelman et al., Enhanced passive targeted energy transfer in strongly nonlinear mechanical oscillators, Jan. 3, 2011, pp. 1-8, J. Sound and Vibration, vol. 330 Issue 1, Elsevier Ltd.

Quinn et al., Efficiency of targeted energy transfers in coupled non-linear oscillators associated with 1:1 resonance captures: Part 1, Apr. 8, 2008, pp. 1228-1248, J. Sound and Vibration, vol. 310 Issues 3-5, Elsevier Ltd.

McFarland et al., Experimental study of non-linear energy pumping occurring at a single fast frequency, International Journal of Non-Linear Mechanics, Jul. 2005, pp. 891-899, vol. 40 Issue 6, Elsevier Ltd.

Tang et al., Simulation and experiment validation of simultaneous vibration control and energy harvesting from buildings using tuned mass dampers, in: Proceedings of the American Control Conference, 2011, pp. 3134-3139, IEEE.

Cottone et al., Nonlinear energy havesting, Physical Review Letters, 2009, pp. 080601, vol. 102 Issue 8, American Physical Society.

Paradiso et al., Energy scavenging for mobile and wireless electronics, IEEE Pervasive Computing, 2005, pp. 18-27, vol. 4 Issue 1, IEEE.

Stanton et al., Nonlinear dynamics for broadband energy harvesting: Investigation of a bistable piezoelectric inertial generator, Physica D, May 15, 2010, pp. 640-653, vol. 239 Issue 10, Elsevier Ltd.

Manevitch et al., New analytical approach to energy pumping problem in strongly nonhomogeneous 2dof systems, Meccanica, Oct. 11, 2006, pp. 77-83, vol. 42 Issue 1, Kluwer Academic Publishers.

Sanders et al., A modular six-directional force sensor for prosthetic assessment: A technical note. J. Rehabilitation Research and Development, Apr. 1997, pp. 195-202, vol. 34 Issue 2, United States Department of Veterans Affairs.

Mokhbery et al., Advances in load cell technology for medical applications. Medical Device and Diagnostic Industry newsletter, Aug. 1, 2006.

Change et al., An optimal g-shaped load cell for two-range loading, Engineering in Agriculture, Environment, and Food, Oct. 1, 2013, pp. 172-176, vol. 6 Issue 4, Elsevier Ltd.

Mantriota et al., Theoretical and experimental study of the performance of at suction cups in the presence of tangential loads, Mechanism and machine theory, May 2011, pp. 607-617, vol. 46 Issue 5, Elsevier Ltd.

Cordero et al., Experimental tests in human-robot collision evaluation and characterization of a new safety index for robot operation, Mechanism and machine theory, Oct. 2014, pp. 184-199, vol. 80, Elsevier Ltd.

Load Cell—introduction & types, Omega.co.uk, 2014, Omega Engineering Limited. http://www.omega.co.uk/prodinfo/load-cells.html.

Principles of measurement used by laser sensors, Acuity, 2014, Schmitt Industries, http://www.acuitylaser.com/support/measurement-principles.

Kretschmar, Understanding sensor resolution specifications and effects on performance. on lionprecision.com. Sep. 2014, Lion Precision, St. Paul, Minnesota http://www.lionprecision.com/tech-library/technotes/article-0010-sensor-resolution.html.

Microtrack 3 product brochure, MTI Instruments, Jun. 12, 2014, Albany, New York.

* cited by examiner

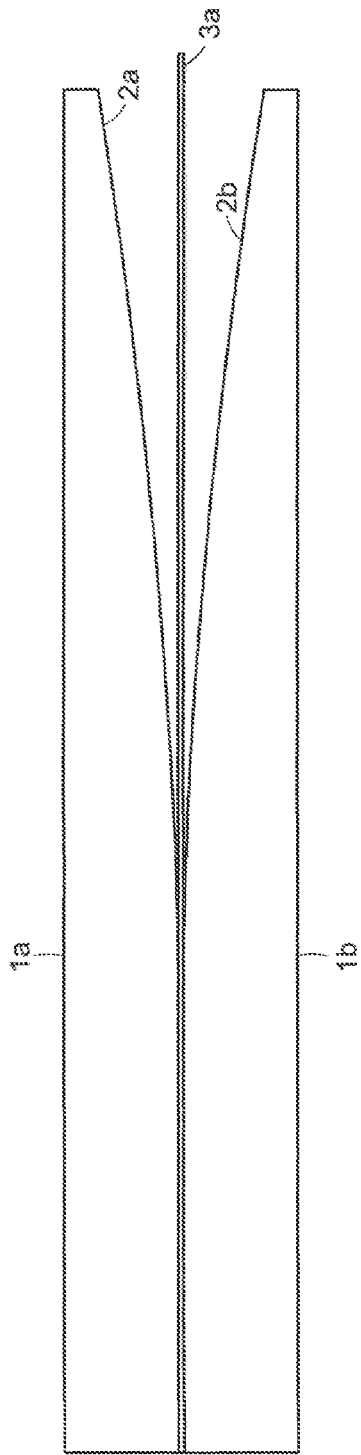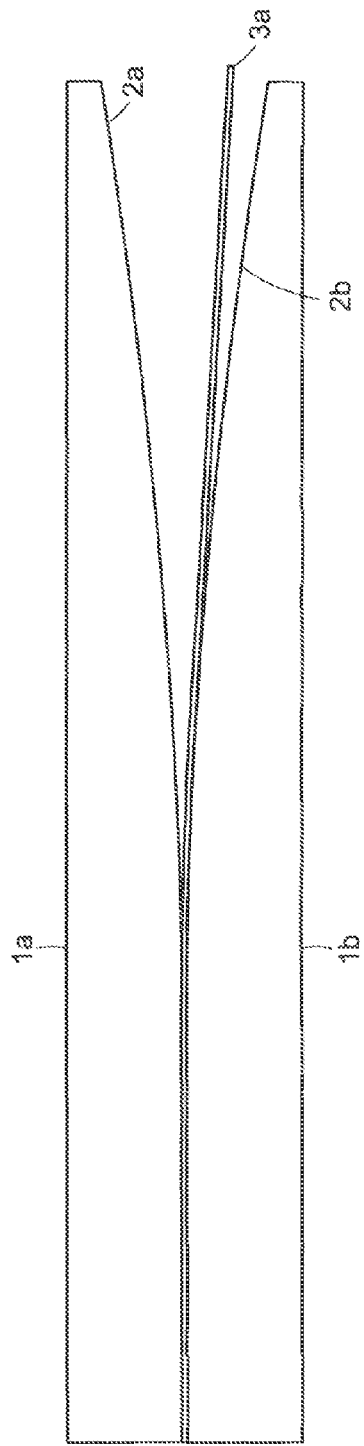

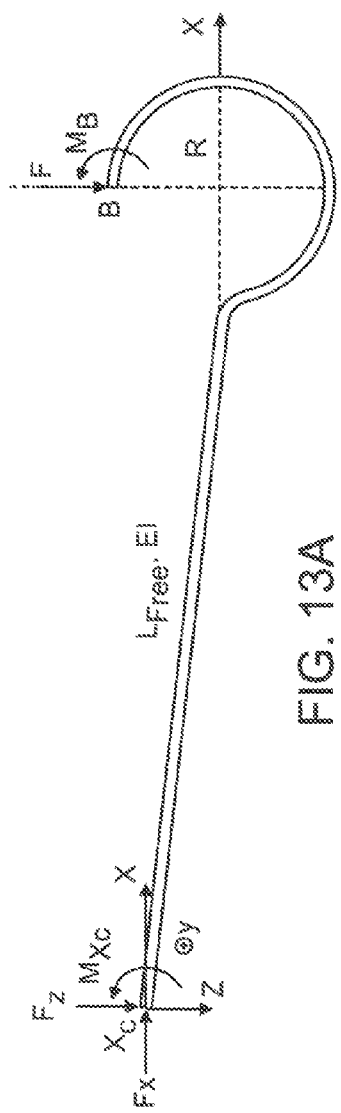
FIG. 13A
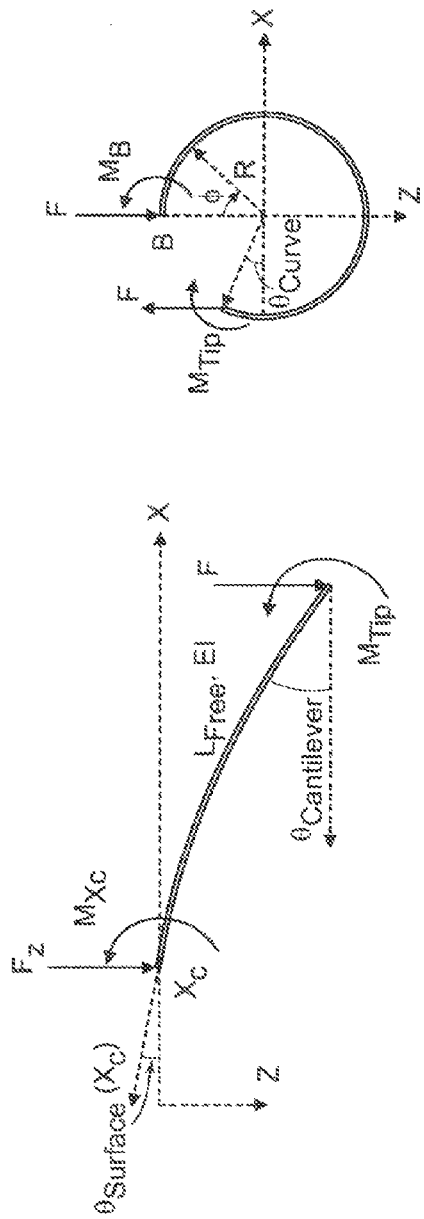
FIG. 13B
FIG. 13C

BEAM-BASED NONLINEAR SPRING

This application claims priority to provisional application Ser. No. 61/941,593 filed on Feb. 19, 2014, the contents of which are incorporated herein by reference in their entirety.

This invention was made with Government support under Contract No. N65540-10-C-003 awarded by the Department of Defense—Department of the Navy. The Government has certain rights in the invention.

BACKGROUND OF THE INVENTION

This relates to a stiffening nonlinear spring formed by a flexible cantilever member wrapping around a curved surface as it deflects.

Several technological processes such as energy harvesting from ambient vibrations, shock absorption from external loads, and passive control or suppression of mechanical instabilities involve targeted energy transfer from one component of a structure to another. In particular, energy harvesting is the process of using ambient energy sources to generate useful forms of energy such as electricity. The energy in these ambient sources is usually spread over a range of frequencies. Applications of energy harvesting may include MEMs sensors implanted in remote locations. Shock absorption is the process of protecting a primary structure from an ambient force or external pressure load. Applications include passive protection of buildings from earthquake excitations, offshore platforms from water waves impacts, or a delicate instrument from external loads. Passive control of mechanical instabilities in another important area that has recently emerged in the context of targeted energy transfer. Examples may include the suppression of aeroelastic instabilities on wings due to fluttering and the elimination of aeroelastic instabilities in suspension bridges.

In all of these cases, one aims to design elements that are capable of transferring the energy irreversibly and efficiently. In typical applications (especially energy harvesting), the ambient vibration can be described as a stochastic, multi-frequency signal that is often characterized by time-varying features. However, traditional single degree of freedom linear vibration harvesters are efficient only close to their design point; that is, when the excitation frequency matches the harvester's natural frequency. Therefore, linear harvesters respond inefficiently to ambient vibrations. In order to absorb ambient vibrations effectively, it is essential for an energy harvester to be characterized by adaptivity (i.e. the ability to adjust its resonance frequency/ies depending on the input spectrum) and robustness (i.e. the ability to maintain its energy harvesting performance even if the excitation varies significantly).

Methods for overcoming this mistiming problem include: designing systems that do not use a spring, control theory of linear spring systems, 2 degree-of-freedom linear systems, continuous linear systems, and nonlinear springs. Below, we give a critical overview of these techniques, focusing on their different advantages and disadvantages.

Mitcheson et al [1] describe a micro-scale coulomb-force parametric generator (CFPG) that absorbs ambient energy without using a spring. Instead of using a spring, the CFPG uses a charged capacitor plate that snaps away from a counter-electrode when excited by large accelerations. Since the CFPG does not have a spring, it does not have a resonant frequency and responds similarly to acceleration signals that have the same magnitude but different frequencies. The CFPG, however, only functions well when the excitation displacement greatly exceeds the allowable travel length of its sliding plate. Another shock absorption device that functions without a spring is the MEMS-fabricated hydraulic valve that fits inside a shoe, as described in [2]. A controller allows hydraulic fluid flowing in between two chambers to pulse on a piezoelectric element. Resulting strain in the piezoelectric element converts the mechanical energy into electric energy. Additionally, [3] discusses a device small enough to fit in a shoe that consists of a clamshell made from two piezoelectric elements. The device flattens with each heel-strike. [3] also reviews other energy harvesting devices that absorb ambient energy without vibrating.

The performance (i.e. peak power output, adaptivity, and robustness) of energy harvesters with linear springs can be improved by using control strategies to alter the oscillator's resonance frequency [4] or creating linear devices with two or more degrees of freedom so that they have multiple resonant frequencies [5]. [4] and [5] present devices with better performance than traditional single linear springs. However, the controlled devices consume some of the collected power, and the multiple degree of freedom systems are bulky and have limited robustness.

Another approach is to use a nonlinear spring. Essentially nonlinear springs—that is nonlinear springs without linear stiffness components—do not have preferential linear frequencies. Therefore, they are more robust to variations in the external excitation and preserve their good performance level for a wide range of conditions [6], [7]. The simplest form of an essentially nonlinear spring is a cubic one. It may be implemented by linear springs supporting a proof mass at nonperpendicular angles. For example, MacFarland et al. [8] investigate the dynamics of a nonlinear oscillator realized by a thin elastic rod (piano wire) clamped at its ends without pretension that performs transverse vibrations at its center. To leading order approximation, the stretching wire produces a cubic stiffness nonlinearity. Despite its success in various applications, this design can suffer from significant frictional losses, especially in small scale applications, due to the guided motion of the moving mass [7]. In addition, there are limitations related to the spring breaking or yielding when the external forces become too large.

A different class of nonlinear springs includes those with negative linear stiffnesses, which are usually characterized by bi-stable configurations. Cottone et al. [9] describe a nonlinear spring implemented by an inverted pendulum with a tip magnet that faces an opposing static magnet. For a small enough gap between the magnets, the cantilever has two equilibria. For small base input accelerations, the tip magnet oscillates linearly about one of the equilibria. For Sufficiently large accelerations, the tip magnet cycles between the two equilibria. This resonance is insensitive to noise.

As described in [10] nonlinear springs may be physically implemented by helical springs with thickening coil wires or changing overall diameters. Another way to achieve nonlinear behavior is by employing multiple linear components that interact more strongly the further they deflect. For example, in the leaf springs of automobile suspensions, several layers of arc-shaped spring steel are clamped together. As the center of the upper are deflects, it contacts the arc below it, and both springs further deflect in contact. As more and more arcs deflect, the spring effectively stiffens. However, the many arcs of the leaf spring result in a lot of friction [10].

Mann and Sims [11] describe an oscillator that is implemented by a magnet sliding in a tube with two opposing magnets as the end caps. This configuration causes the stiffness to be the summation of a linear and cubic component. A disadvantage of this device is that the sliding magnet loses energy due to friction as it slides along the tube.

In [12], an ultra-wide bandwidth resonator is made out of a doubly-clamped piezoelectric beam. The double-clamps cause the cantilever to stretch as it bends, resulting in a non-linear stiffness. However, the beam also has a linear stiffness. The linear stiffness is negligible compared to the nonlinear stiffness when the beam's residual stiffness is minimized. Consequently, efforts to minimize the linear stiffness component hinder the system optimization.

A nonlinear spring is also useful for the application of measuring forces as a load cell. Load cells are useful for applications ranging from material strength testing to prosthetic limb sensing (Sanders et al.) [13], monitoring infusion pumps delivering drugs (Mokhbery) [14], agricultural product sorting (Chang and Lin) [15], suction cup strength measuring (Messina) [16], and human-robot collision force sensing (Cordero et al) [17].

Load cells can measure forces via several different methods, including hydraulic or pneumatic pistons and deforming materials. For hydraulic or pneumatic load cells, the force is applied to a piston that covers an elastic diaphragm filled with oil or air respectively, and a sensor converts a pressure measurement to a force measurement. Use of hydraulic load cells is limited by high cost and complexity. Pneumatic load cells are limited by slow response times and a requirement for clean, dry air, Smith [18]. The most common load ceils are solid materials that deform when subject to an applied force.

Deforming load cells come in many different shapes, such as bending beams (a cantilever), S-beams (an "S"-shaped configuration of beams), single point load cells (a double-clamped beam, for which the force measurement is insensitive to the position of the load along the beam), shear beam load cells (an I-beam produces a uniform shear 15 across its cross-section that can be measured by strain gauges), and "pancake" load cells (round, at beams) [18]. All of these load cells deflect linearly.

Traditional linear load cells can be designed for almost any force capacity. Bending beam load cells are typically used for force ranges of $5.0 \times 10^{-1}$ to $2.5 \times 10^4$ N and pancake load cells can be used for force ranges up to $2.5 \times 10^6$ N, Smith [18]. Many linear load cells are designed to withstand a limited amount of force overcapacity using oversteps that prevent over-deflection; typically up to 50-500% load capacity before breaking [19]. Because they deform linearly, these load cells also have constant resolution (that is, the smallest force increment that they can measure) for their entire force range.

There are several challenges to designing a load cell. One wants to reduce the load cell mass and volume in order to minimize its effect on the test sample. Additionally, the load cell should have minimal hysteresis for accurate measurements in both up-scale and down-scale, and low side-load sensitivity (response to parasitic loads) [18]. One of the most critical design challenges is the trade-off between force sensitivity and range: It is desirable to maximize strain or deflection in the load cell in order to increase force measurement resolution because strain and deflection sensors have limited resolution; typically 14-bits between 0 and their maximum rated measurement [20, 21, 22]. Simultaneously, one wants to maximize the load cell's functional force range and protect it from breaking due to forces that exceed that range, which requires limiting its strain.

Different studies have made various modifications to the traditional linear load cell to increase its force range and sensitivity, and minimize side-load sensitivity. Chang and Lin [15] studied a "capital G-shaped" load cell with two force ranges: for small forces, a top sensitive flexure deflected alone. For large forces, the sensitive flexure contacted a stiffer flexure, and the two flexures deflected together at the higher stiffness. In this way, the load cell was more sensitive to small forces, and did not yield for large forces. Other devices use multiple linear load cells of increasing stiffnesses in series, as described in several U.S. patents, (Storace and Sette [23], Suzuki et al. [24]). The multiple load cells of a device deflect together until overload stops prevent the weaker load cells from deflecting too far, after which the suffer load cells continue to deflect. A microcontroller determines which load cell measurement to display. Using this approach, [23] was able to measure weight over a range of 1 g to 30 Kg. One way to minimize sensitivity to side-loads such as undesired moments is to use multiple load cells (i.e. 3) and take the average force measurement [23]. Challenges with these designs are that the linear load cell components have limited resolution, and using multiple load cells in one device may be bulky or expensive.

Another approach for designing a load cell with high force resolution and capacity is to use a nonlinear mechanism rather than a linear one. A nonlinear load cell may have a low stiffness for low forces (and therefore high force sensitivity) and a high stiffness at large forces (and therefore protection from yielding due to over-deflection). The design may also be volume compact and inexpensive due to requiring only one nonlinear spring and sensor per device.

SUMMARY OF THE INVENTION

The present invention is a nonlinear spring that does not have limitations related to factors such as large friction, large volume, many parts which reduce the overall lifetime, or important linear stiffness components. The present invention is useful for purposes such as energy harvesting, shock absorption, and force measurements.

One embodiment considers a cantilever beam that oscillates between two contact surfaces with carefully selected curvature. The resulting nonlinear spring has a negligible linearized component, the order of its nonlinearity does not remain constant but increases as the amplitude gets larger, and the spring achieves a theoretically infinite force for a finite displacement. The last property is of crucial importance since it allows the device to act as a typical spring with polynomial nonlinearity for moderate vibration amplitudes and to effectively behave as a vibro-impact spring for larger amplitudes.

The nonlinear oscillator can be a one-degree-of-freedom oscillator or a component in a multi-degree-of-freedom oscillator. Nonlinear oscillators are useful in targeted energy transfer applications such as ambient energy harvesting because they are adaptive and robust to the stochastic, multi-frequency signals of ambient vibrations. Furthermore, nonlinear oscillators maximize the power dissipated when they have large amounts of damping, whereas linear oscillators tend to maximize the power dissipated for low amounts of damping. For energy harvester applications, an energy harvester with a large amount of damping tends to be more robust to the presence of parasitic damping (less power decay) than a harvester with low parasitic damping.

The nonlinear spring may also be used to make a stiffening load cell. A load cell that uses the present invention has a force resolution that is high for small forces and lower for large forces, which allows a high force accuracy over a large force range. Also, the stiffening behavior and geometry prevent it from breaking for forces well beyond its designed range.

The hardening nonlinearity of the springs in the load cell allow the load cell to deflect a large distance for small forces and incrementally smaller distances for larger forces. For very large forces, the flexible members of the load cell effectively do not bend further because they are already in contact with the surfaces along the full flexible member length. The surfaces are significantly stiffer than the flexible members and can be designed to negligibly deform themselves in all desired applications.

In one aspect, the nonlinear spring according to the invention includes two opposed curved surfaces curving away from one another and a flexible cantilever member disposed between the two opposed curved surfaces. A mass is attached to a free end of the cantilever member wherein the flexible cantilever member wraps around one of the curved surfaces as the cantilever member deflects to form a nonlinear spring. In a preferred embodiment of this aspect of the invention the curved surfaces have a variable radius of curvature along their length. In one embodiment, the curved surfaces have an infinite radius of curvature at their root and radius of curvature decreases with distance from the root. The opposed curved surfaces may include teeth to reduce mechanical damping.

In another aspect, the invention is an energy harvesting device including a flexible cantilever member anchored to a curved surface curving away from the cantilever member. A mass including a permanent magnet is attached to an end of the cantilever member and a fixed coil is located in close proximity to the mass whereby electrical energy is generated as the flexible cantilever member deflects.

In yet another aspect, the invention is a nonlinear load cell including a first member having a symmetrical member with a left and a right curved surface; a second symmetrical member with a left and a right curved surface opposite the first symmetrical member with the curved surfaces curving away from each other. The first member has an anchor point for attachment to an external structure. A second member is displaced parallel to the first member and includes a symmetrical member with left and right curved surfaces and a second symmetrical member with a left and a right curved surface opposite the first symmetrical member with the curved surfaces curving away from each other. The second member has an anchor point to an external structure. A total of four substantially cantilevered beams are provided with first and second sets of left and right cantilever beams projecting from center regions of both first and second members respectively and left and right connection structures connecting left cantilever beam ends and right cantilever beam ends respectively. In a preferred embodiment of this aspect of the invention, the connection structures further include rotational spring elements connecting the cantilever beam ends. It is preferred that strain gauges be applied to the cantilever beams to measure strain. In another embodiment, a linear motion sensor is provided between the first and second members and the connection structure.

BRIEF DESCRIPTION OF THE DRAWING

FIG. 1 is a side view showing an embodiment in an oscillator application, where there is no force applied to the cantilever tip.

FIG. 2 is a side view showing an embodiment in an oscillator application, where a downward force is applied to the cantilever tip.

FIG. 13a is a free body diagram of a free cantilever segment in a load cell.

FIG. 13b illustrates a free cantilever section of the free body diagram.

FIG. 13c is a three-quarter ring section of the free body diagram.

DESCRIPTION OF THE PREFERRED EMBODIMENT

Figure 3:
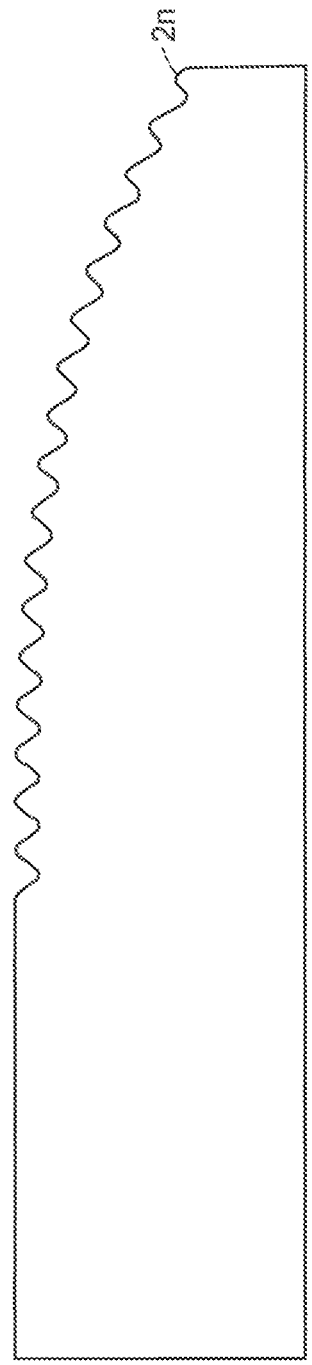
FIG. 3 is a side view showing a possible feature modification to the surfaces 2a and 2b.

FIG. 1 is a side view of an embodiment of the invention disclosed herein. The embodiment in FIG. 1 has a depth into the page. In this embodiment, a beam 3a is clamped between top surface 1a and bottom surface 1b. In this embodiment, the beam 3a is a cantilever. In other embodiments, the right end of beam 3a may have another boundary condition or be attached to another object. In this embodiment, curves 2a and 2b are flat at their leftmost ends so that they clamp beam 3a. To the right of the flat segment, Curves 2a and 2b have decreasing radius of curvature along their lengths in the right direction.

FIG. 2 shows that cantilever 3a wraps around the bottom surface curve 2b when a downward force is applied to the tip of cantilever 3a. In this embodiment, for increasing forces, an increasing segment of the cantilever contacts the surface, starting at the root. If an upward force is applied to the cantilever tip 3a, then the cantilever would wrap around the top surface curve 2a.

The present invention can be made to be any size and out of a large range of materials. Dimension limitations and applied force limitations are related to the stress in the deflected beams 3 and rotational springs 20.

Other embodiments may have different features. Some of these features may be teeth cut along the curves 2a and 2b, as shown on curve 2n in FIG. 3. These teeth may be useful for reducing mechanical damping of the oscillator. Other features may be that curves 2a and 2b have radii of curvature that do not necessarily decrease as the distance from the leftmost end increases.

Further, the concept of a stiffening member can be extended from a one-dimensional beam 3a wrapping around a one-dimensional curved surface 2a or 2b to a two-dimensional or three-dimensional flexure. For example, the two-dimensional flexure may be a conical coil spring or a plate. The three-dimensional flexure may be a shell, for example. For a two-dimensional flexure, the surfaces 2a and 2b may be two-dimensional shapes where the curvature changes as the radius from the origin increases, for example. For a three-dimensional flexure, the surface may be a three-dimensional sphere or ellipsoid, for example.

Figure 4:
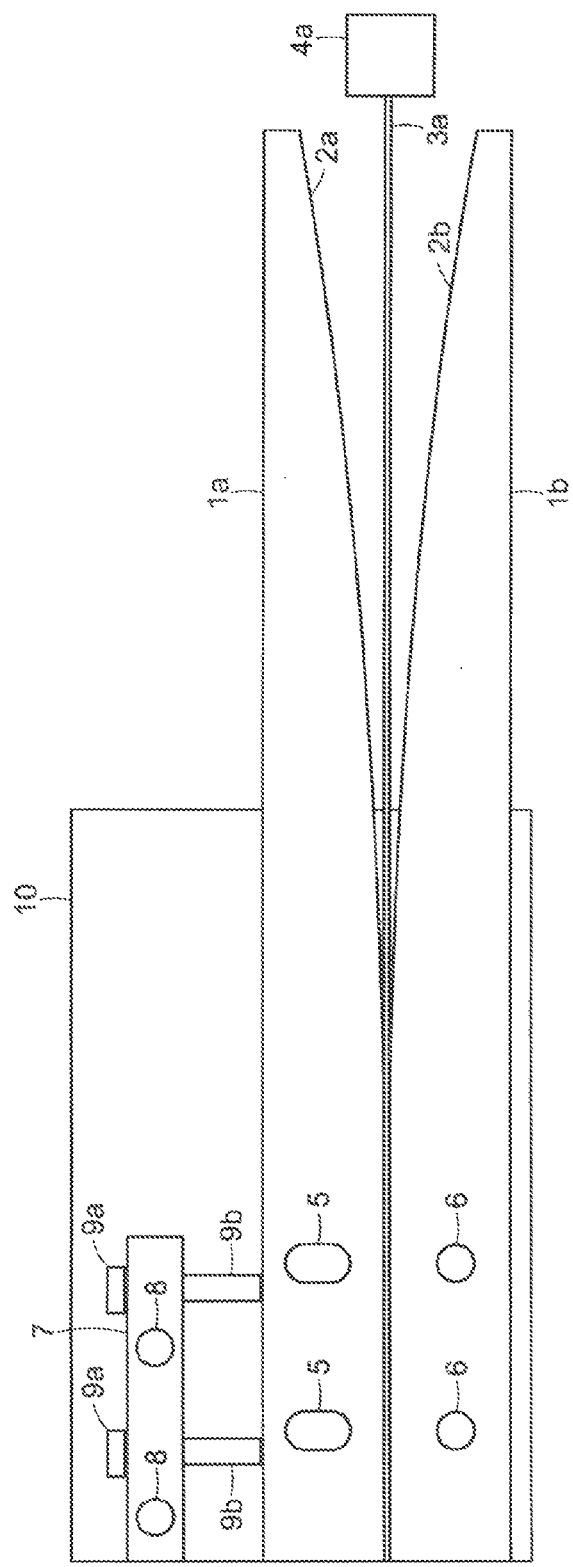
FIG. 4 is a side view showing a possible assembly method of an embodiment in an oscillator application.

FIG. 4 shows a possible assembly method of the embodiment. End-mass 4a may be fixed to the cantilever tip. Holes 6 may be used to bolt bottom surface 1b to backplate 10. Slots 5 may be used to bolt surface 1a to backplate 10. Hole 8 may be used to bolt top bar 7 to backplate 10. Bolts 9a-9b may be screwed through a bole in the top of top bar 7 so that they push down on surface 1a. This assembly clamps cantilever 3a in between surfaces 1a and 1b.

Figure 5:
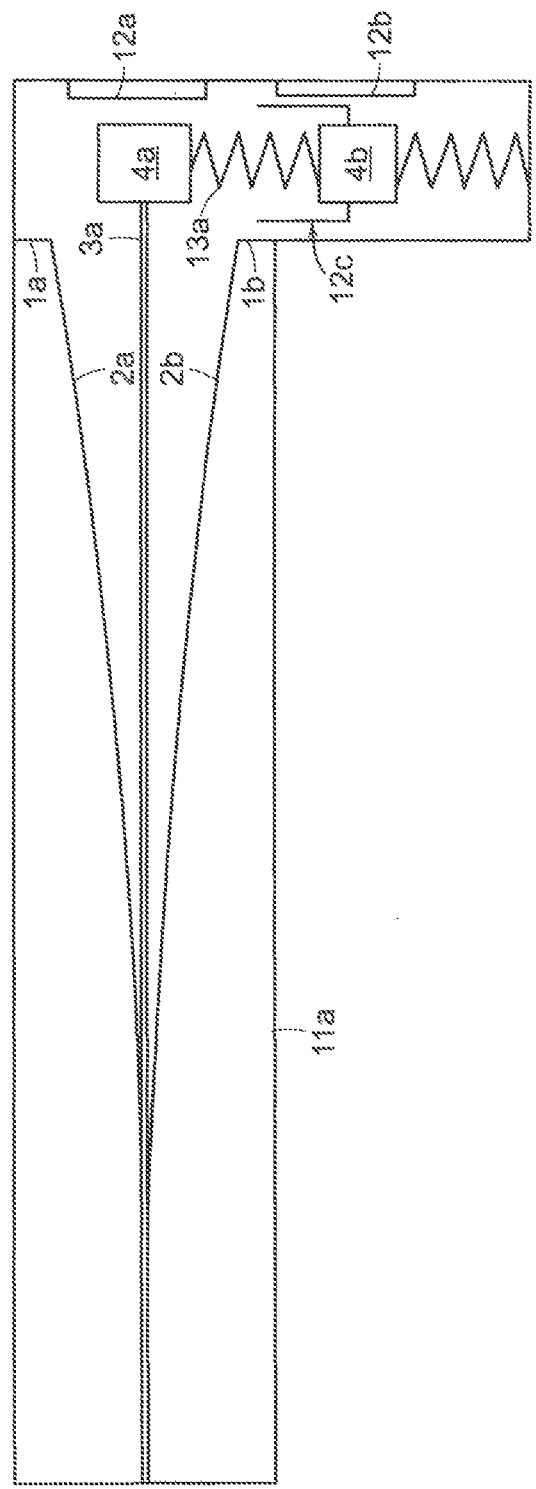
FIG. 5 is a side view showing an embodiment as a component in a two degree-of-freedom oscillator application.

FIG. 5 shows an embodiment of the stiffening spring as a component in a two degree-of-freedom oscillator application. Mass 4a is connected by spring 13a to the device outer casing 11a. Mass 4b is connected by linear spring 13a to end-mass 4a. The embodiment in FIG. 5 may be an electromagnetic energy harvester if masses 4a and 4b are magnets. 12a and 12b may be coils rigidly attached to outer casing 11a. Coil 12c may be rigidly attached to mass 4b. Mechanical energy may be dissipated due to the relative motion of coil 12c and mass 4a when 4a is a magnet. Mechanical energy may also be dissipated due to the motion of 4a relative to coil 12a and of 4b relative to 12b when 4a and 4b are magnets.

Figure 6:
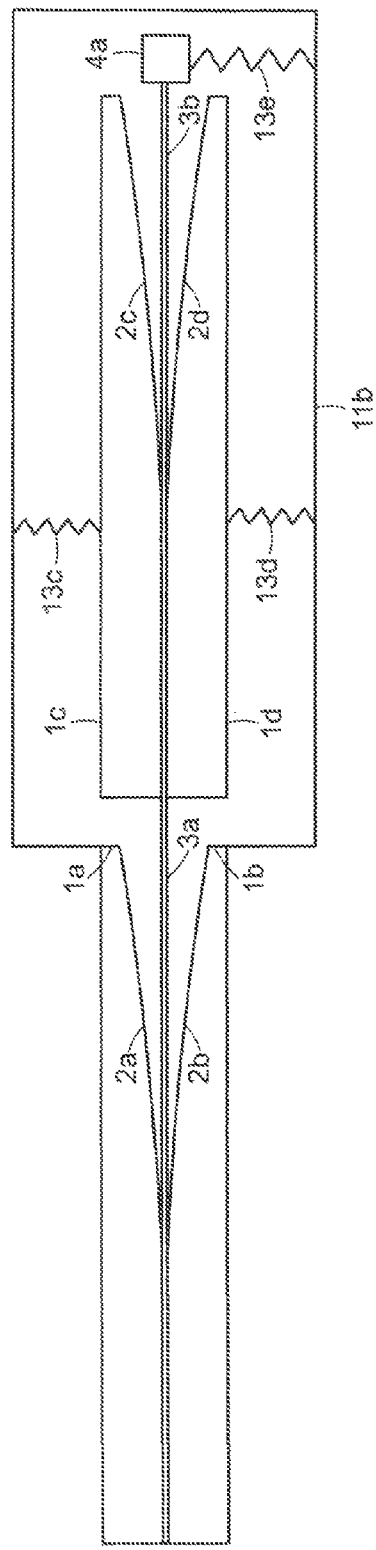
FIG. 6 is a side view showing an embodiment as components in a two-degree-of-freedom oscillator application.

FIG. 6 shows the embodiment as components in a two-degree-of-freedom oscillator application. 4a is one mass of the oscillator. Surfaces 1c and 1d, which are rigidly attached to one another, are the second mass of the oscillator. Spring 13c connects surface 1c to the outer casing 11b, and spring 13d connects surface 1d to outer casing 11b. Spring 13e connects end mass 4a to outer casing 11b.

The present invention may be used as a spring component in other oscillators and systems as well. Other systems may use any number and configuration of the present invention. In energy applications, the present invention may be used with transducers such as electromagnetic systems, piezoelectric systems, and electrostatic systems among others. Electromagnetic system configurations, for example, may use the masses 4a and 4b as magnets or coils. The piezoelectric system, for example, may use cantilever 3a as the piezoelectric element.

Figure 7:
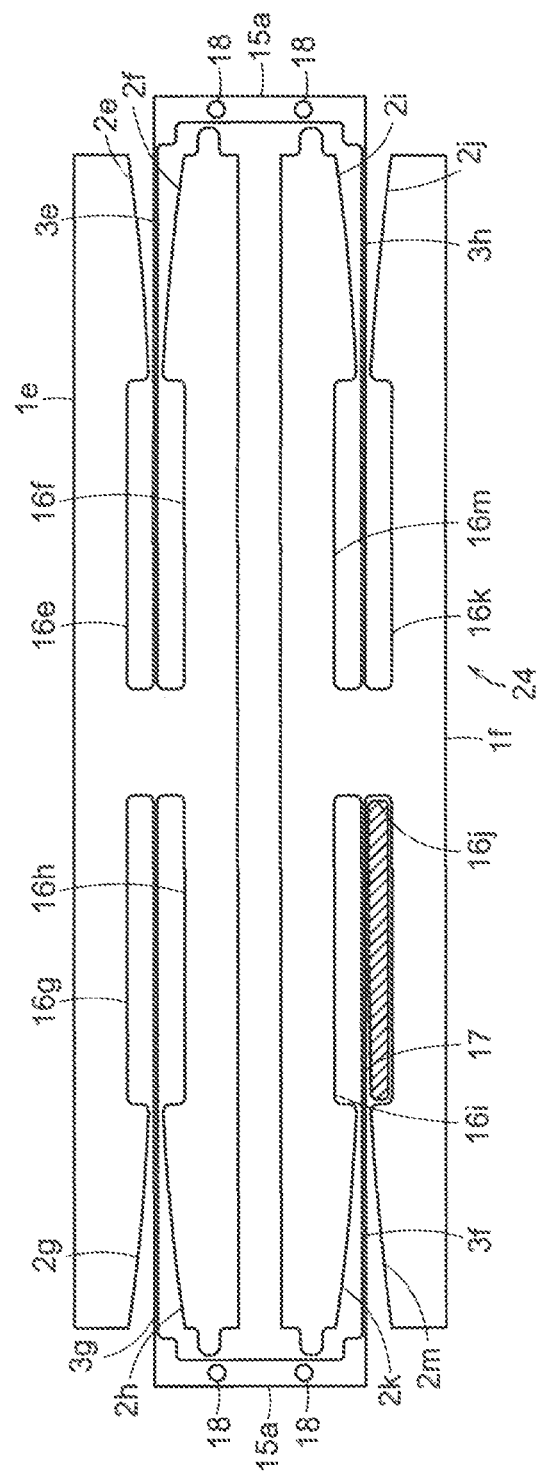
FIG. 7 is a front view showing an embodiment in a load cell application, where there is no force applied to the top and bottom.

In the embodiment shown in FIG. 7, surfaces 1f and 1e are rigid. Rigid vertical bars 15a connect cantilever 3e to 3h and 3g to 3f. The rigid vertical bar 15a may have holes 18 for purposes such as attaching an optical sensor. In the embodiment of FIG. 7, a sufficiently large compressive force applied to 1e and 1f causes beam 3e to begin to partly wrap around curve 2e, beam 3g to begin to wrap around curve 2g, beam 3f to begin to wrap around curve 2m, and beam 3h to begin to wrap around curve 2j. In the embodiment of FIG. 7, a sufficiently large tensile force applied to 1e and 1f causes beam 3e to begin to partly wrap around curve 2f, beam 3g to begin to wrap around curve 2h, beam 3f to begin to wrap around curve 2k, and beam 3h to begin to wrap around curve 2i.

Surfaces 1e and 1f may have holes 16e-16m cut into the roots of surface curves 2e-2m. Holes 16e-16m may be necessary to satisfy manufacturing practices that may not be able to cut a point at the intersections of 3e with 1e, 3g with 1e, 3f with 1f, and 3h with 1f. When surfaces 1e and If have holes 16e-16m, insert 17 may be made to fit into all or some of holes 16e-16m. The presence of insert 17 extends the length of curves 2e-2m.

The top surface 1e be may be connected to the object of interest while the bottom surface may be connected to the tabletop. The displacement measurements of this load cell embodiment could be measured by an optical sensor or eddy-current sensor that compares the displacement of the top surface 1e to the bottom surface 1f. The force acting on the load cell could also be determined by measuring the strain on a strain gauge 20a located on the flexible member 3 or 20 (see FIG. 9).

For example, if an optical sensor can detect changes as small as 0.1 μm, then to achieve 1% accuracy in the force measurement requires a change in displacement per force: $dy/dF \geq 1 \times 10^{-7}$ m/0.01 F. For F=0.01 N [1 gram], it is desirable, then, to have a stiffness of $K=dF/dy \leq 1000$ N/m. For F=1,000 N [100 Kg], it is desirable to have $K \leq 1e8$ N/m.

Figure 8:
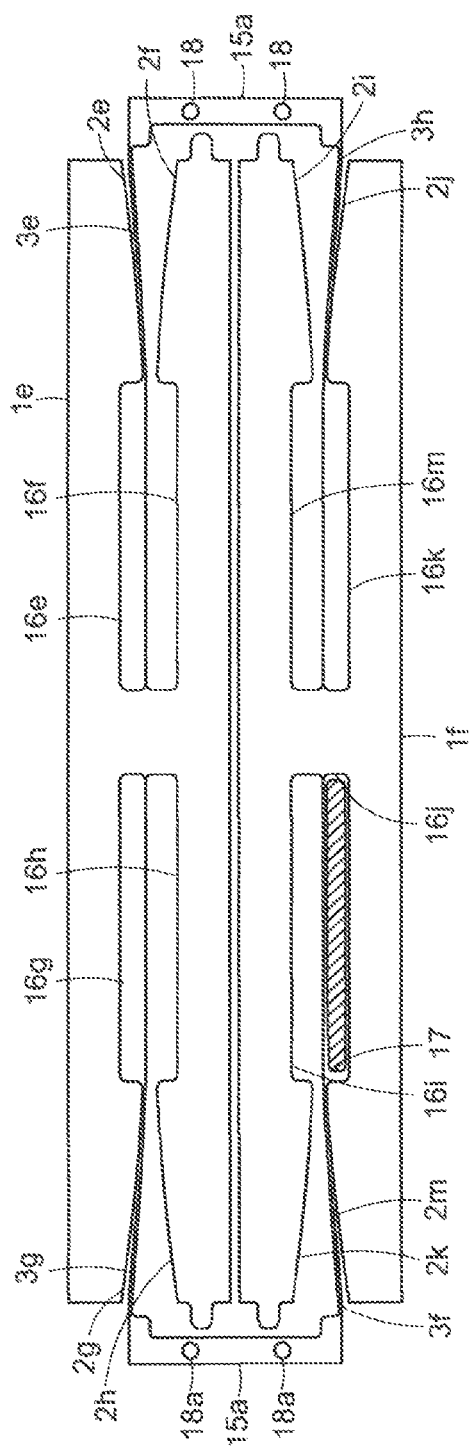
FIG. 8 is a front view drawing showing an embodiment in a load cell application, where there is a compressive force applied to the top and bottom.

FIG. 8 shows the deflected load cell embodiment when a compressive force is applied on surfaces 1e and 1f.

Figure 9:
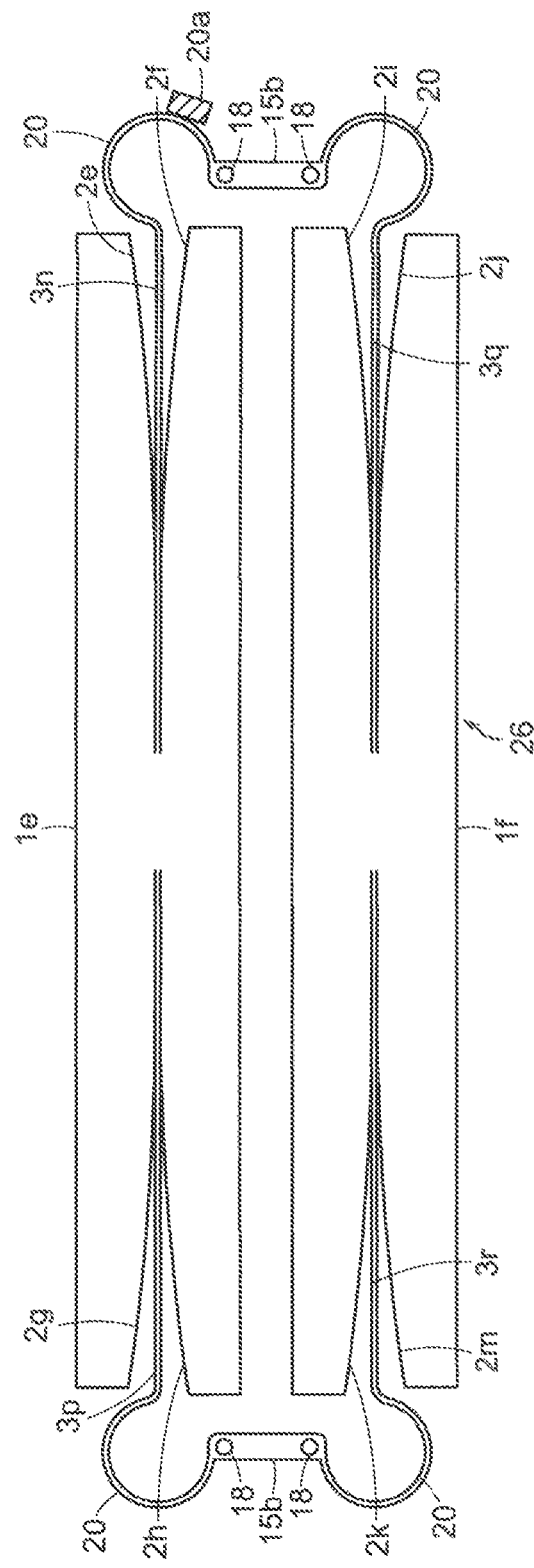
FIG. 9 is a front view showing an embodiment in a load cell application, where there is no force applied to the top and bottom.

FIG. 9 shows the undetected load cell with rotational springs 20 connecting the tips of cantilevers 3 and vertical bars 15b. Rotational spring 20 may be realized by a 270-degree curved beam. The rotational spring 20 may be useful for reducing the stress in deflected beams 3n, 3p, 3q, and 3r.

Figure 10:
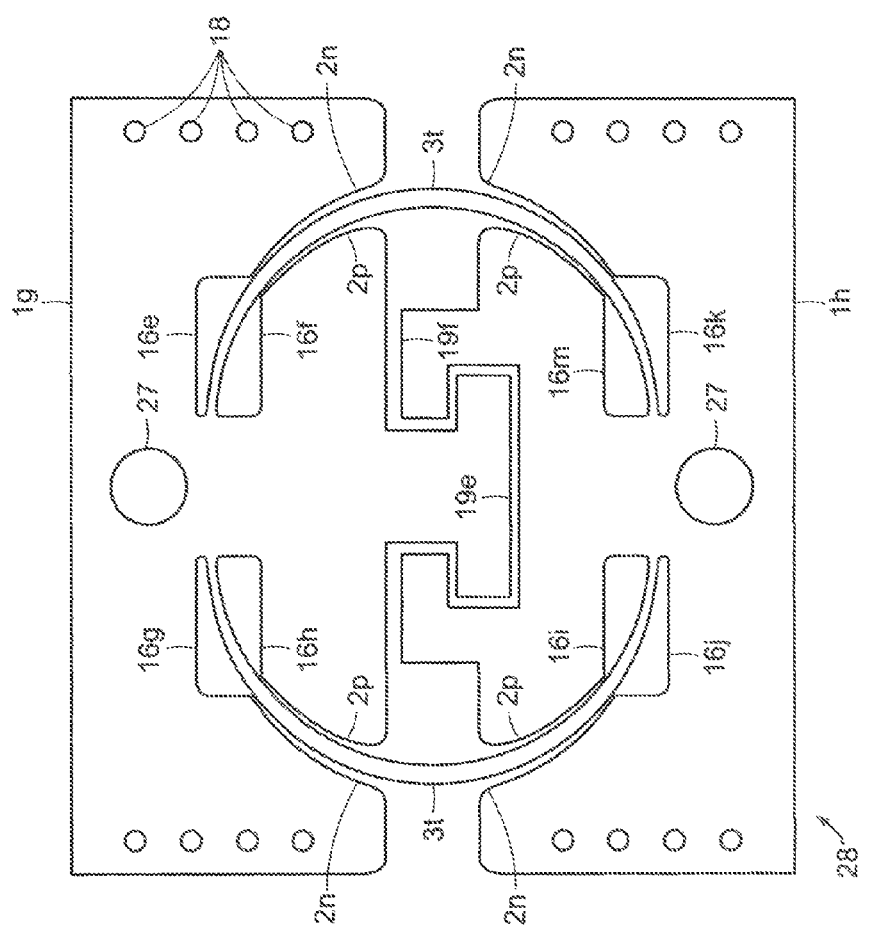
FIG. 10 is a front view showing a load cell embodiment when the flexible members of the load cell are naturally curved beams.

FIG. 10 shows an undeflected embodiment of the nonlinear load cell 28. Curved beams 3t wrap around rigid outer surface curves 2n when a compressive force is applied to the rigid surfaces 1g, 1h. Curved beams 3t wrap around the rigid inner surface curves 2p when a tensile force is applied to the rigid surfaces 1g, 1h—possibly via the holes 27. Load cell 28 may be manufactured from one monolithic part with cut-outs 16e-16m to satisfy manufacturing finite cutting constraints. Interlocking bodies 19e and 19f may be used to limit load cell deflection in both tension and compression by contacting each other when a certain deflection between the rigid surfaces 1g and 1h has occurred.

The concept of stiffening members 3e, 3f, 3g and 3h in load cells 24 and 26, as shown in FIGS. 7 and 9 can be extended from one-dimensional beams 3 wrapping around one-dimensional curved surfaces 2 to two-dimensional or three-dimensional flexures. For example, the two-dimensional flexures 3 may be a conical coil spring or a plate. The three-dimensional flexure 3 may be a shell, for example. For a two-dimensional flexure, the surfaces 2 may be two-dimensional shapes where the curvature changes as the distance from the origin increases, for example. For a three-dimensional flexure, the surface may be a three-dimensional sphere or ellipsoid, for example.

The present invention can be made to be any size and out of a large range of materials. Dimension limitations and applied force limitations are related to the stress in the deflected beams 3 and rotational springs 20.

Here we briefly summarize the theory for the force, deflection, and stress relationships for designing the vibrating spring and load cells. Designing the spring or load cell maximum stress to remain below a certain value increases its fatigue lifetime. Further details and equation derivations can be found in the journal article J. M. Klager et al., "Robust Energy Harvesting from Walking Vibrations by means of Nonlinear Cantilever Beams," Journal of Sound and Vibrations (2014), http://dx.doi.org/10.1016j.jsv.2014.11.035.

Figure 11:
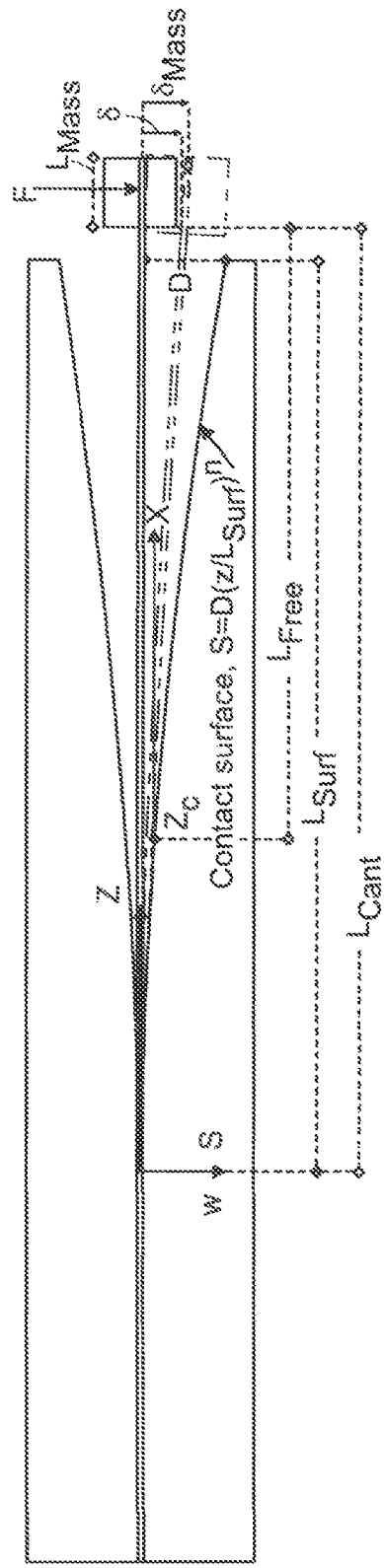
FIG. 11 is a cross-sectional view of a nonlinear spring implemented by a cantilever beam that vibrates between two curved surfaces, according to an embodiment of the invention.

As shown in FIG. 11, we choose a surface with the curve $$S = D\left(\frac{z}{L_{Surf}}\right)^n, \qquad (1)$$

where D is the gap between the surface end and undeflected cantilever, and n is an arbitrary power greater than 2 (a requirement for essential nonlinearity), z is a spatial coordinate measured from the cantilever/surface root, and $L_{Surf}$ is the surface length. The theory derived below should apply to any surface with a monotonically increasing curvature, $$\frac{d^2 S}{dx^2}.$$

When a sufficiently larger force F is applied to the beam tip, the cantilever begins to wrap around the surface. The contact point $z_c$ is the axial coordinate where the cantilever stops wrapping around the surface and becomes a free beam of length $L_{Free}$. To the left of the contact point, we assume that the beam is tangent to (equal to) the surface shape given by eq. (1). For the free beam segment to the right of the contact point, the boundary conditions on the beam are $$w(x=0) = S(z_c), \quad \frac{dw(0)}{dx} = \frac{dS}{dz}\bigg|_{z=z_c}, \quad \frac{d^2 w(x=L_{Free})}{dx^2} = 0, \quad (2)$$

$$\frac{d^3 w(x=L_{Free})}{dx^3} = \frac{-F}{EI},$$

where w is the beam deflection along its free length, F is the force applied to the mass, $L_{Free}$ is the cantilever segment to the right of the contact point $z_c$, EI is the cantilever rigidity, S is the surface shape defined in eq. (1), $z_c$ is the contact point between the cantilever and surface for the given force, and x is the spatial coordinate with its origin at $z_c$. Based on Euler-Bernoulli beam theory and solving $$\frac{d^4 w}{dx^4} = 0,$$

the deflection along the free beam length, x, is $$w(x) = \frac{1}{EI}\left(S(z_c) + \frac{dS(z_c)}{dz} \cdot x + \frac{FL_{Free}}{2}x^2 - \frac{F}{6}x^3\right). \quad (3)$$

Substituting $x=L_{Free}$ into eq. (3), the beam tip deflection due to the force F is $$\delta = \frac{FL_{Free}^3}{3EI} + \frac{dS}{dz}\bigg|_{z=z_c} \cdot L_{Free} + S(z_c), \quad (4)$$

We can slightly modify eq. (4) to describe the deflection of the end-mass center $\delta_{Mass}$ by accounting for the beam tip angle:

$$\delta_{Mass} = \delta + \frac{d\delta}{dz}\frac{L_{Mass}}{2}, \quad (5)$$

where $L_{Mass}$ is the length of the undeflected end mass in the z direction. In eq.s (4) and (5), we assume that $L_{Mass}$ is small and causes a negligible moment on the beam tip. Eq.s (4) and (5) and the following equations may straightforwardly be modified for larger $L_{Mass}$ and other beam loading conditions.

The location of the contact point $z_c$ along the surface is the point at which the cantilever curvature equals the surface curvature (surface contact condition):

$$\frac{d^2 S}{dz^2}\bigg|_{z=z_c} = \frac{d^2 w}{dz^2}\bigg|_{z=z_c} = \frac{d^2 w}{dx^2}\bigg|_{x=0}. \quad (6)$$

This is the case because the free cantilever curvature decreases along its length (cantilever gets flatter), while the surface curvature is constant (n=2) or increases (n>2) along its length (surface gets rounder), $z_c$ is the point where the surface would no longer prevent the natural curvature of the free cantilever. Alternatively, at $z_c$, the curvature at the root of a free cantilever of length $L_{Free}$ subject to tip force F equals the surface curvature to which it is tangent. The boundary condition defined by Eq. (6) is required for static equilibrium because no external moment is applied to the beam at the contact point.

The free beam length is the full beam length minus the beam length in contact with the surface. Assuming a slender beam, the beam length in contact with the surface is approximately equal to the surface are length from z=0 to $z_c$. For small deflections, one can assume that $$L_{Free} = L_{Cant} - z_c.$$

Further using the slender Euler-Bernoulli beam theory, the maximum stress magnitude, σ, in the beam cross-section is $$\sigma = -Ec\frac{d^2 w}{dz^2}, \quad (7)$$

where E is the beam elastic modulus, $$c = \frac{h}{2}$$

is half the beam height and $$\frac{d^2 w}{dz^2}$$

is the beam curvature. For the beam segment in contact with the surface, $$\frac{d^2 w}{dz^2}$$

can be found by using w(z)=s(z) and differentiating eq. (1). For the free beam segment, $$\frac{d^2 w}{dz^2}$$

can be found by differentiating eq. (3).

Figure 12A:
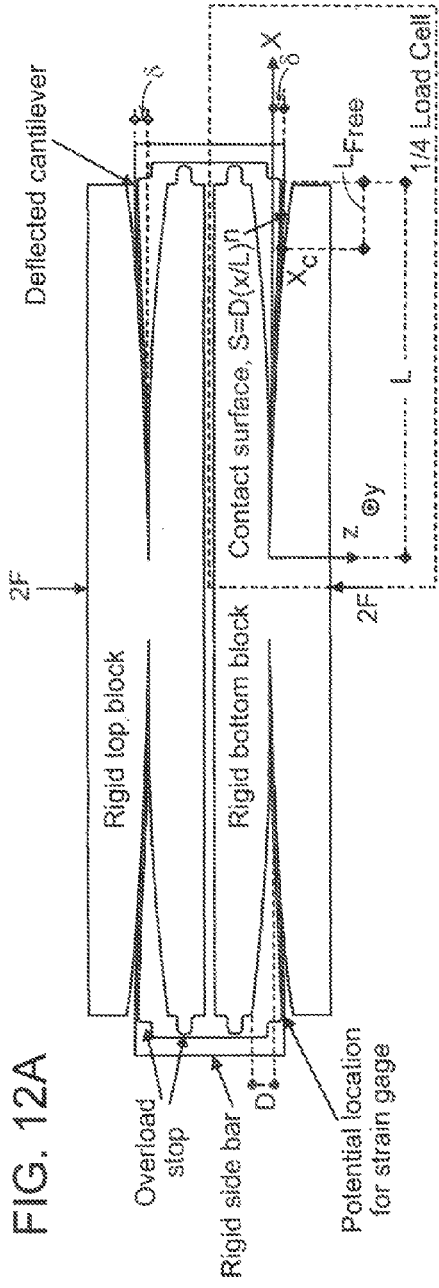
FIG. 12a is a cross-sectional view of an embodiment of the invention disclosed herein showing a load cell with rigid connections and deflected in compression.
Figure 12B:
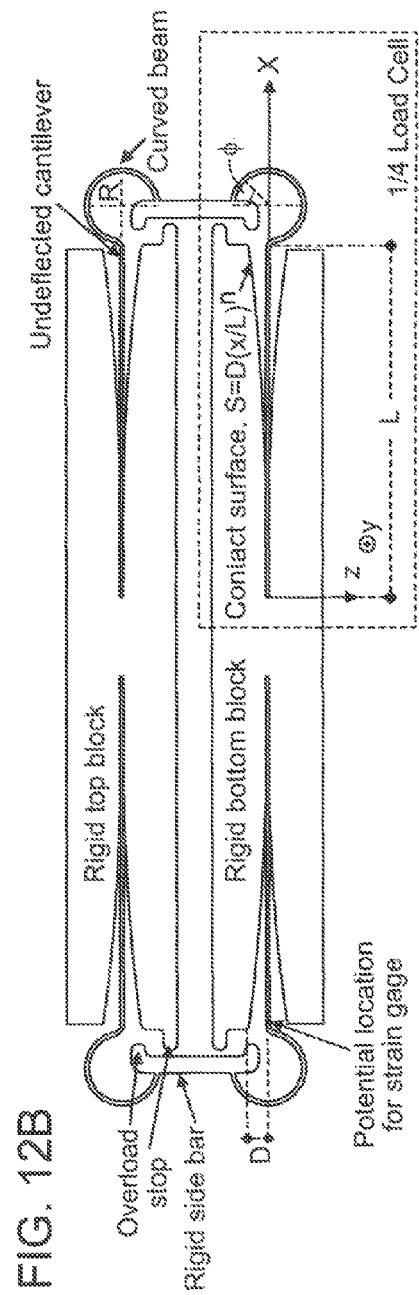
FIG. 12b is a cross-sectional view of a load cell having rigid connections in an undetected stage with rotational spring connections physically realized by 270° arcs.

As shown in FIGS. 12a and b, each load cell consists of a 2×2 symmetrical grid of nonlinear spring elements. Load cell deflection occurs between the top and bottom rigid blocks. The nonlinear springs are physically realized by cantilevers wrapping around the rigid surfaces as they deflect, splitting each cantilever into a "cantilever segment in contact with the surface" and "free cantilever segment". The junction between the cantilever segment in contact and free cantilever segment is the contact point, $x_c$. The tips of the bottom cantilevers connect to the tips of the top cantilevers by rigid bars, which cannot rotate due to symmetry. The cantilever tips may be rigidly connected to these vertical bars (FIG. 12a) or connected to the vertical bars by moment compliance rings hereafter referred to as "¾ rings" (the 270° arcs shown in FIG. 12b).

Below, we describe the relationship of the ¼ load cell's applied force F, contact point $x_c$, tip moment $M_{Tip}$, and deflection $\delta$. When F is applied to the ¼ load cell and the ¼ load cell deflects by $\delta$, the complete load cell experiences the applied force 2F and deflection 2$\delta$.

The ¼ surface shape follows the curve $$S = D\left(\frac{x}{L_{Surf}}\right)^n, \quad (8)$$

where D is the gap between the surface end and undetected cantilever, and n is an arbitrary power greater than or equal to 2, x is a spatial coordinate measured from the cantilever/surface root, and $L_{Surf}$ is the surface length. The theory derived below should apply to any surface with a monotonically increasing curvature, $$\frac{d^2S}{dz^2}.$$

Referring to FIGS. 13a, b and c, the internal moment along the free cantilever segment as a function of distance x from the full cantilever root is $$M_{Internal,Cant} = -F(L-x) + M_{Tip}, \quad (9)$$

where F is the applied force on the ¼ load cell, L is the length of the full cantilever, and $M_{Tip}$ is the moment applied at the junction of the cantilever and ¾ ring. The internal moment along the ¾ ring is $$M_{Internal,ring} = FR(1+\sin\phi) + M_{Tip}, \quad (10)$$

where R is the radius of the ¾ ring and $\phi$ is the angle along the ¾ ring.

Using Euler-Bernoulli beam theory and equating the angle of the cantilever tip to the angle of the ¾ ring at $\phi=3\Pi/2$, the value of $M_{Tip}$ as a function of the applied force F and contact point $x_c$ is $$M_{Tip} = \frac{(-3\Pi R^2 - 2R^2 + L_{Free}^2)F + 2\frac{dS(x_c)}{dx}EI}{3\Pi R + 2L_{Free}}, \quad (11)$$

where $L_{Press} \approx L - x_c$ (using small beam deflection approximation) is the free cantilever segment length, $$\frac{dS(x_c)}{dx}$$

is the slope of the surface at the contact point found by differentiating eq. (8), and EI is the cantilever and ¾ ring rigidity.

At the contact point, the cantilever curvature must be continuous because there is not an applied external moment. To the left of the contact point, we assume that the cantilever segment in contact with the surface is tangent to the surface. Then, the contact point relates to the applied force F and tip moment $M_{Tip}$ by $$\left.\frac{d^2S}{dx^2}\right|_{x_c} = \left.\frac{M_{Internal,Cant}}{EI}\right|_{x_c} \rightarrow \left.\frac{d^2S}{dx^2}\right|_{x_c} = \frac{F(L-x_c) - M_{Tip}}{EI}. \quad (12)$$

Eq.s (11) and (12) can be simultaneously solved to relate the applied force F, tip moment $M_{Tip}$, and contact point $x_c$.

Having determined F, $M_{Tip}$, and $x_c$, the deflection of the ¼ load cell indicated in FIG. 2 relative to the rigid block is the summation of four components:

$$\delta = \delta_1 + \delta_2 + \delta_3 + \delta_4. \quad (13)$$

The first component is the cantilever deflection at the contact point $x_c$. This deflection component is the vertical location of the surface curve at $x_c$:

$$\delta_1 = S(x_c) \quad (14)$$

The second component is the deflection of the free cantilever segment due to the cantilever's slope at the contact point. Since the beam is tangent to the surface at the contact point, its slope equals the surface slope. The free length of the beam rotates by this slope (i.e. small angle) about the contact point, which results in the deflection:

$$\delta_2 = \left.\frac{dS}{dx}\right|_{x_c} \cdot L_{Free}, \quad (15)$$

where $L_{Free} = L - x_c$ is the length of the free cantilever segment, assuming small deflection and small surface curves, $S(x_c)$. The third deflection component is due to the free cantilever segment bending. Using Euler-Bernoulli beam theory, integrating the moment-curvature relation given by eq. (9), and using boundary conditions that the deflection and slope due to bending equal zero at the free cantilever segment root (the contact point, $x_c$), this deflection component is:

$$\delta_3 = \frac{FL_{Free}^3}{3EI} - \frac{M_{Tip}L_{Free}^2}{2EI}. \quad (16)$$

The fourth deflection component is due to the ¾ ring bending. When an infinitesimal segment of the ¾ ring, $\delta l = Rd\Phi$, bends, it rotates the segments of the ring on either side of it by an angle $\delta\theta = \Delta\kappa\delta l$ with respect to each other, where $\Delta\kappa$ is the change in the curvature of the beam at the infinitesimal segment due to bending $$\left(\Delta\kappa = \frac{M_{Internal,Ring}}{EI}\right).$$

Based on geometry and the small angle approximation, the vertical tip deflection due to this change in angle is the horizontal distance between the infinitesimal segment and the tip, $X=R(1+\sin\phi)$, multiplied by the change in angle, $\delta\theta$. Integrating this infinitesimal deflection along the curved beam results in the total deflection of the curved beam due to bending:

$$\delta_4 = \int_{l_{Ring}} X\delta\theta \rightarrow \delta_4 = \frac{(9\Pi+8)FR^3 + (6\Pi+4)M_{Tip}R^2}{4EI}. \quad (17)$$

The ¼ load cell stiffness is $K=dF/d\delta$. The entire load cell stiffness is also $K=dF/d\delta$.

Again using Euler-Bernoulli beam theory, the normal stress in the cantilever segment in contact with the surface can be found by $$\sigma = \frac{Eh\kappa}{2}, \quad (18)$$

where E is the cantilever elastic modulus, h is the beam height, and $$\kappa = \frac{d^2S}{dx^2}$$

(assuming the cantilever segment in contact with the surface is tangent to the surface). The normal stress in the free cantilever segment and ¾ ring can be found by $$\sigma = \frac{M_{Internal}h}{2I}, \quad (19)$$

where $M_{Internal}$ is the internal moment in the free cantilever segment (eq. (9)) or in the ¾ ring (eq. (10)), h is the cross-sectional height, and I is the cross-sectional moment of inertia.

Figure 14:
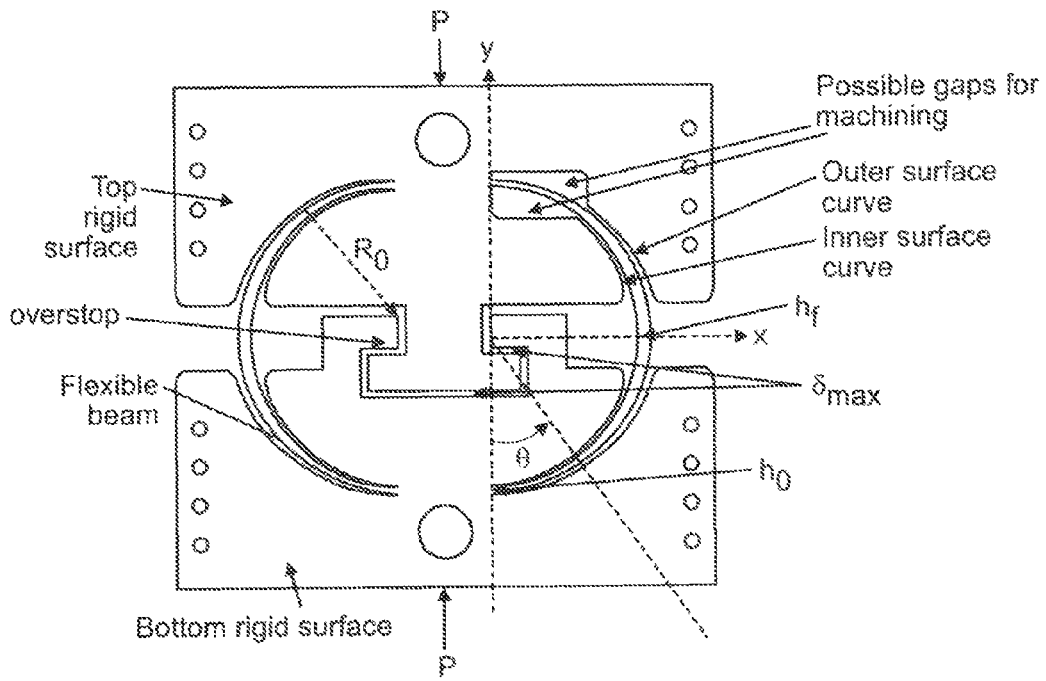
FIG. 14 is a schematic illustration of a circular load cell in an embodiment of the invention disclosed herein.

As shown in FIG. 14, we design a load cell similar to the straight-beam load cell shown in FIG. 12a and b but now with curved beams instead of straight beams. The load cell is loaded by a tensile or compressive force, P. We derive the theory for the load cell in compression mode. The theory derived here could be straightforwardly altered for tension mode. The load cell consists of four symmetrical quadrants. In this derivation, we consider the bottom right quadrant, which extends from $\theta_R=0$ to $\theta_R=\Pi/2$. $\theta_R$ is the angle along the undeflected curved beam with respect to the vertical. $\theta_S$ is the angle along the curved surface with the same arc length from the vertical as $\theta_R$:

$$l(\text{Surf}(\theta_S)) = l(\text{Ring}(\theta_R)) \rightarrow \theta_R = \frac{l(\text{Surf}(\theta_S))}{R_0}, \quad (20)$$

where we assume that the ring arc length equals $R_0\theta_R$. The flexible curved beams have mean radii $R_0$. The curved beams have cross-sectional height h which may vary along the angle $\theta$. We may choose to keep h constant along $\theta_R$ or vary the height along $\theta_R$ according to $$h = h_0 + \frac{h_f - h_0}{\left(\frac{\Pi}{2}\right)^q}\theta_R^q, \quad (21)$$

where q is an arbitrary power. Eq. (21) is valid from $0 \leq \theta_R \leq \Pi/2$ and then symmetrical in the other load cell quadrants. The outer rigid surface has shape $S_{out}(\theta_s)$ and the inner rigid surface has shape $S_{In}(\theta_{s,In})$, defined in polar coordinates. The outer and inner surfaces have curvatures $\kappa_S$ and $\kappa_{S,In}$, respectively. The rigid surfaces have monotonically increasing curvatures, $$\frac{d^2S}{d\theta_S^2} \geq 0.$$

The load cell may deflect up to a total distance $\delta_{max}$, after which oversteps prevent further deflection from additional force. The load cell may be fabricated with gaps if the fabrication technique cannot allow the curved beam root to meet the rigid surface at a point.

Figure 15:
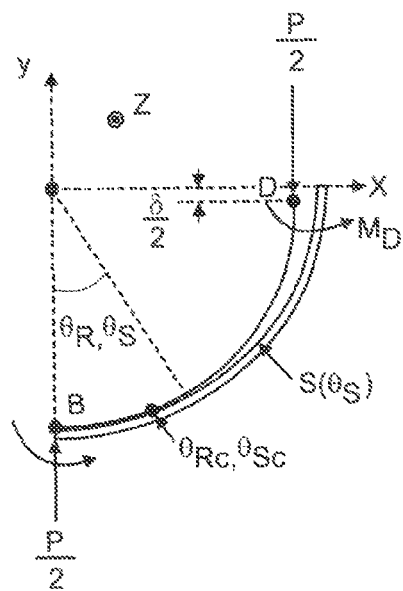
FIG. 15 is a free body diagram and schematic of a bottom right quarter of the circular load cell in compression.

Below, we derive the theory for the bottom right quadrant of the circular load cell in compression, shown in FIG. 15. When P is applied to the entire load cell, P/2 is applied to each load cell quarter due to horizontal symmetry of the load cell quarters. When the quarter load cell deflects by $\delta/2$, the entire load cell deflects by $\delta$ due to vertical symmetry of the load cell quarters.

The equation for the internal moment in the z direction along the curved beam as a function of the angle with respect to the vertical, $\theta_R$, is $$M = \frac{PR_0}{2}(1 - \sin\theta_R - M_D), \quad (22)$$

where $M_D$ is the moment in the z-direction acting at the top of the ¼ load cell.

Next, we determine the relationship of the applied force P/2, moment $M_D$, and contact point $\theta_{Rc}$ by simultaneously solving two equations. First, the rotation of the ring at point D with respect to point B must be 0 due to symmetry. That is, $$\phi_D = \phi_c + \int_{\theta_{Rc}}^{\Pi/2} \Delta\kappa R_0 d\theta_R = \phi_c + \int_{\theta_{Rc}}^{\Pi/2} \frac{M}{EI} R_0 d\theta_R = 0. \quad (23)$$

$\phi_c$ is the change in angle of the ring at the contact point:

$$\phi_c = \theta_{Rc} - \tan^{-1}\left(\frac{dy}{dx}\bigg|_{\theta_{Sc}}\right), \quad (24)$$

where $\theta_{Rc}$ is the angle of the contact point on the undetected ring (before the force is applied) and $$\tan^{-1}\left(\left.\frac{dy}{dx}\right|_{\theta_{Sc}}\right)$$

is the angle of the surface at the contact point, $\theta_{Sc}$ (one way to find the surface angle with respect to the horizontal, $$\left.\frac{dy}{dx}\right|_{\theta_{Sc}}$$

is to convert $S(\theta_{Sc})$ from polar to Cartesian coordinates).

For the ¼ ring, the internal energy from $\theta_R=0$ to the [unknown] contact point $\theta_R=\theta_{Rc}$, depends on how much the ring curvature changes to match the surface curvature to which it is tangent. This internal energy due to bending is $$U_1 = \frac{E}{2}\int_0^{\theta_{Rc}} I\left(\frac{1}{R_0}-\kappa_S(\theta_S)\right)^2 R_0 d\theta_R, \quad (25)$$

where E is the curved beam elastic modulus, and I is the cross section moment of inertia (which may be a variable function, along $\theta_{Rc}$, i.e. if the cross-section height is defined by eq. (21)). The surface curvature $\kappa_S(\theta_S)$ can be converted to a function of $\theta_R$ using eq. (20).

From the [unknown] contact point $\theta_R=\theta_{Rc}$ to $\theta_R=\Pi/2$, the internal energy depends on the internal moment in the ring that causes bending. This internal energy component is $$U_2 = \frac{1}{2E}\int_{\theta_{Rc}}^{\Pi/2} IM^2 R_0 d\theta_R, \quad (26)$$

where the internal moment M is defined in eq. (22). The total internal energy in the ¼ ring is $$U=U_1+U_2. \quad (27)$$

Next, we minimize the internal energy U with respect to the contact point $\theta_R$. That is, we solve $$\frac{\partial U}{\partial \theta_R}=0. \quad (28)$$

To find the relationship of the applied force P/2, moment $M_D$, and contact point $\theta_{Rc}$, we may simultaneously solve eq.s (23) and (28) for a fixed force and geometric parameters.

To find the deflection of the ¼ load cell, we rearrange Castiglaino's first theorem into $$\frac{\delta}{2} = \int_0^{P/2} \frac{\frac{\partial U(P)}{\partial F}}{F} dF, \quad (29)$$

where the internal energy is a function of the dummy variable, the applied force, F.

Again, the stiffness of the load cell is $K=dP/d\delta$.

Finally, the equations for stress in the load cell are similar to those of the vibrating spring and straight beam load ceil. For the curved beam segment in contact with the rigid surface, the normal stress is $$\sigma = \frac{Eh\Delta\kappa}{2}, \quad (30)$$

where $\Delta\kappa=R_0-\kappa_S(\theta_S)$ is the required change in the beam curvature for it to be tangent to the surface. The normal stress in the tree segment of the curved beam is $$\sigma = \frac{Mh}{2I}, \quad (31)$$

where M is a function of $\theta_R$ defined in eq. (22) and h may be the function of $\theta_R$ defined in eq. (21)

A fuller mathematical analysis underpinning the present invention may be found in the provisional application referred to earlier and in J. M. Kluger et al., "Robust Energy Harvesting from Walking Vibrations by means of Nonlinear Cantilever Beams," Journal of Sound and Vibrations (2014). The contents of this reference is incorporated herein by reference in its entirety. The numbers in square brackets refer to the references listed herein.

REFERENCES

1. P. Mitcheson, T. Green, E. Yeatman, A. Holmes, Architectures for vibration-driven micropower generators, J. Microelectromechanical Systems, 13 (2004) (3) pp. 429-440.
2. A. Hajati, S. Bathurst, H. Lee, S. Kim, Design and fabrication of a nonlinear resonator for ultra wide-bandwidth energy-harvesting applications, in: Proceedings of the IEEE International Conference on Micro Electro Mechanical Systems (MEMs), 2011, pp. 130-1304.
3. O. Yaglioglu, Modeling and design considerations for a micro-hydraulic piezoelectric power generator, Master's thesis, Massachusetts Institute of Technology (2002).
4. O. Gendelman, T. Sapsis, A. Vakakis, L. Bergman, Enhanced passive targeted energy transfer in strongly nonlinear mechanical oscillators, J. of Sound and Vibration 330 (2011) pp. 1-8.
5. D. Quinn, O., Gendelman, G. Kerschen, T. Sapsis, L. Bergman, A. Vakakis, Efficiency of targeted energy transfers incoupled nonlinear oscillators associated with 1:1 resonance captures: Part i, J. Sound and Vibration (2008) pp. 1228-1248.
6. A. Vakakis, O. Gendelman, L. Bergman, D. McFarland, G. Kerschen, Y. S. Lee, Nonlinear Targeted Energy Transfer in Mechanical and Structural Systems, Springer, 2009.
7. D. McFarland, L. Bergman, A. Vakakis, Experimental study of non-linear energy pumping occurring at a single fast frequency, international Journal of Non-Linear Mechanics 40 (2005) pp. 891-899.
8. X. Tang. L. Zuo, Simulation and experiment validation of simultaneous vibration control and energy harvesting from buildings using tuned mass dampers, in: Proceedings of the American Control Conference, 2011, pp. 3134-3139.
9. F. Cottone, H. Vocca, L. Gammaitoni, Nonlinear energy harvesting, Physical Review Letters (2009) 102 (8) pp. 080601.
10. J. Paradiso, T. Starner, Energy scavenging for mobile and wireless electronics, IEEE Pervasive Computing 4 (1) (2005) pp. 18-27.
11. S. Stanton, C. McGehee, B. Mann, Nonlinear dynamics for broadband energy harvesting: Investigation of a bistable piezoelectric inertial generator, Physica D 239 (2010) pp. 640-653.

12. L. Manevitch, A. Musienko, C. Lamarque, New analytical approach to energy pumping problem in strongly non-homogeneous 2dof systems, Meccanica (2007) 77-83.

13. J. Sanders, R. Miller, D. Berglund, S. Zachariah, A modular six-directional force sensor for prosthetic assessment: A technical note, J. Rehabilitation Research and Development, (1997) 34 (2) pp. 195-202.

14. J. Mokhbery, Advances in load cell technology for medical applications, Medical Device and Diagnostic industry newsletter, Accessed online September, 2014.

15. Y.-S. Chang, T.-C. Lin, An optimal g-shaped load cell for two-range loading. Engineering in Agriculture, Environment, and Food, (2013) 6(4) pp. 172-176.

16. G. Mantriota, A. Messina, Theoretical and experimental study of the performance of at suction cups in the presence of tangential loads, Mechanism and machine theory, (2011) 46 (5) pp. 607-611.

17. A. Cordero, G. Carbone, M. Ceccarelli, J. Echavarri, J. Munoz, Experimental tests in human-robot collision evaluation and characterization of a new safety index for robot operation, Mechanism and machine theory, (2014) 80, pp. 185-199.

18. J. Smith, Electronic Scale Basics, Key Markets Publishing, 1991.

19. O. E. Limited, An introduction to load cells, history, theory & operating principles (2014). URL http://www.omega.co.uk/prodinfo/load-cells.html 20. Acuity, Principles of measurement used by laser sensors (2014), URL http://www.acuitylaser.com/support/measurement-principles.

21. Lion, Understanding sensor resolution specifications and effects on performance (2014). URL http://www.lion-precision.com/tech-library/technotes/article-0010-sensor-resolution.html 22. Microtrack 3, Tech. rep., MTI Instruments (2014), 23. A. Storace, P. Sette, Leaf spring weighing scale, U.S. Pat. No. 4,037,675.

24. S. Suzuki, Y. Nishiyama, T. Kitagawa, Multi-range load cell weighing scale, U.S. Pat. No. 4,711,314.

What is claimed is:

1. A nonlinear load cell comprising:
a first member further including a first symmetrical member with a left and a right curved surface;
a second member displaced parallel to the first member and including a second symmetrical member with a left and a right curved surface, the first and second members having first and second anchor points to receive tensile or compressive forces; and
a total of four cantilevered beams including a left and a right cantilever beam projecting out from center regions of both first and second members respectively; and left and right connection structures connecting left cantilever beam ends to each other and right cantilever beam ends to each other respectively.

2. The nonlinear load cell of claim 1 wherein the connection structures further comprise rotational spring elements connecting the cantilever beam ends.

3. The nonlinear load cell of claim 1 further comprising strain gauges on the cantilever beams to measure strain.

4. The nonlinear load cell of claim 1 further comprising a linear motion sensor between the first and second members.

* * * * *